(12) United States Patent
He (10) Patent No.: US 11,482,184 B2
(45) Date of Patent: Oct. 25, 2022

(54) ROW DRIVE CIRCUIT OF ARRAY SUBSTRATE AND DISPLAY DEVICE

(71) Applicant: HKC CORPORATION LIMITED, Guangdong (CN)

(72) Inventor: Huailiang He, Guangdong (CN)

(73) Assignee: HKC CORPORATION LIMITED, Guangdong (CN)

( * ) Notice: Subject to any disclaimer, the term of this patent is extended or adjusted under 35 U.S.C. 154(b) by 76 days.

(21) Appl. No.: 17/043,695

(22) PCT Filed: Dec. 20, 2018

(86) PCT No.: PCT/CN2018/122353
§ 371 (c)(1),
(2) Date: Sep. 30, 2020

(87) PCT Pub. No.: WO2020/113692
PCT Pub. Date: Jun. 11, 2020

(65) Prior Publication Data
US 2021/0065645 A1    Mar. 4, 2021

(30) Foreign Application Priority Data

Dec. 5, 2018 (CN) .......................... 201811484751.X (51) Int. Cl.
*G09G 3/36* (2006.01)
*G02F 1/1368* (2006.01)

(52) U.S. Cl.
CPC ......... *G09G 3/3677* (2013.01); *G02F 1/1368* (2013.01); *G09G 2310/0264* (2013.01); *G09G 2310/08* (2013.01); *G09G 2320/0233* (2013.01)

(58) Field of Classification Search
CPC ......... G09G 3/3677; G09G 2310/0264; G09G 2310/08; G09G 2310/0243–025; G02F 1/1368
See application file for complete search history.

(56) References Cited

U.S. PATENT DOCUMENTS 5,969,744 A    10/1999 Sakashita et al.
2014/0132491 A1    5/2014 Kim et al.
(Continued)

FOREIGN PATENT DOCUMENTS

| CN | 103927982 A | 7/2014 |
| CN | 106783888 A | 5/2017 |

(Continued)

OTHER PUBLICATIONS

First Office Action in counterpart Chinese Application No. 201811484751.X, dated Dec. 25, 2019.
(Continued)

*Primary Examiner* — Roy P Rabindranath (57) ABSTRACT

Disclosed are a row drive circuit of array substrate and a display device. The row drive circuit includes N row drive units (10) arranged in cascade and auxiliary circuit units. The $N^{th}$ row drive unit (10) is configured to output $N^{th}$ gate driving signal to pre-charge and charge the $N^{th}$ row of sub-pixels, when its signal input end receives the gate driving signal output by $(N-2)^{th}$ row drive unit (10). The $N^{th}$ auxiliary circuit unit (20) is configured to control $N^{th}$ row drive unit (10) skip pre-charging the sub-pixels, when $(N-1)^{th}$ timing control signal received by the first timing signal input end of $N^{th}$ auxiliary circuit unit and $(N+1)^{th}$ timing control signal received by the second timing signal input end of $N^{th}$ auxiliary circuit unit are high level. N is positive integer greater than or equal to two.

19 Claims, 7 Drawing Sheets

(56) References Cited

U.S. PATENT DOCUMENTS

| | | | | |
|---|---|---|---|---|
| 2015/0109353 A1* | 4/2015 | Yu | ....................... | G09G 3/3677 |
| | | | | 377/64 |
| 2016/0086562 A1* | 3/2016 | Tan | ..................... | G11C 19/184 |
| | | | | 345/215 |
| 2017/0249916 A1* | 8/2017 | Jen | ....................... | G09G 3/3677 |

FOREIGN PATENT DOCUMENTS

| CN | 107978290 A | 5/2018 |
|---|---|---|
| CN | 108492789 A | 9/2018 |
| CN | 108648715 A | 10/2018 |
| CN | 108694916 A | 10/2018 |
| CN | 108806634 A | 11/2018 |
| CN | 108922485 A | 11/2018 |
| CN | 109389924 A | 2/2019 |

OTHER PUBLICATIONS

The Second Office Action in counterpart Chinese Application No. 201811484751.X, dated Sep. 14, 2020.
International Search Report in corresponding PCT Application No. PCT/CN2018/122353, dated Sep. 4, 2019.
Written Opinion of the International Searching Authority in corresponding PCT Application No. PCT/CN2018/122353, dated Sep. 4, 2019.

\* cited by examiner

ROW DRIVE CIRCUIT OF ARRAY SUBSTRATE AND DISPLAY DEVICE

CROSS-REFERENCE TO RELATED APPLICATIONS

The present disclosure is the National Stage of International Application No. PCT/CN2018/122353, filed Dec. 20, 2018, which claims the priority of Chinese Patent Application No. 201811484751.X, entitled "ROW DRIVE CIRCUIT OF ARRAY SUBSTRATE AND DISPLAY DEVICE", filed on Dec. 5, 2018, which is hereby incorporated by reference in its entirety.

FIELD

The present disclosure relates to the technical field of electronic circuit, and in particular to a row drive circuit of an array substrate and a display device.

BACKGROUND

Currently, liquid crystal display panel which adopts dual-gate pixel driving structure commonly sends out two dot signals to prevent flicker of images. However, charging the pixels may be affected at the ramping up phase of the waveform of the data signal when being converted. The theory goes like this: the step voltage of the data voltage is too large to make a consistent charging of adjacent two pixels. As a result, brightness on the display panel is uniform, and the image quality of the display panel is reduced.

SUMMARY

It is therefore one main objective of the disclosure to provide a row drive circuit of an array substrate, and a display device, aiming to improve the image quality of the display device.

In order to achieve the above objective, the present disclosure provides a row drive circuit of an array substrate, which includes:

N row drive units arranged in cascade, each of the row drive units includes a signal input end, and a gate driving signal output end;

a plurality of auxiliary circuit units with each of the auxiliary circuit units corresponding to one of the row drive units, each of the auxiliary circuit units comprises a first timing signal input end, a second timing signal input end, a first controlled end, and an output end; the first timing signal input end of the $N^{th}$ auxiliary circuit unit receives the $(N-1)^{th}$ timing control signal, the second timing signal input end of the $N^{th}$ auxiliary circuit unit receives the $(N+1)^{th}$ timing control signal, the first controlled end and the output end of the $N^{th}$ auxiliary circuit unit are connected to the output end of the $N^{th}$ auxiliary circuit unit is connected to the gate driving signal output end of the $N^{th}$ row drive unit;

the $N^{th}$ row drive unit is configured to output a $N^{th}$ gate driving signal to pre-charge and charge $N^{th}$ row of sub-pixels when its signal input end receives the gate driving signal output by the $(N-2)^{th}$ row drive unit;

the $N^{th}$ auxiliary circuit unit is configured to control the $N^{th}$ row drive unit and skip pre-charging the sub-pixels, when the $(N-1)^{th}$ timing control signal received by the first timing signal input end of the $N^{th}$ auxiliary circuit unit and the $(N+1)^{th}$ timing control signal received by the second timing signal input end the $N^{th}$ auxiliary circuit unit are both high level; and N is a positive integer greater than or equal to two.

The present disclosure further provides a row drive circuit of an array substrate, which includes:

N row drive units arranged in cascade, each of the row drive units includes a signal input end, a pull-up control signal end, and a gate driving signal output end; and a plurality of auxiliary circuit units with each of the auxiliary circuit units corresponding to one of the row drive units, each of the auxiliary circuit units comprises a first timing signal input end, a second timing signal input end, a first controlled end, and an output end; the first timing signal input end of the $N^{th}$ auxiliary circuit unit receives the $(N-1)^{th}$ timing control signal, the second timing signal input end of the $N^{th}$ auxiliary circuit unit receives the $(N+1)^{th}$ timing control signal, the first controlled end of the $N^{th}$ auxiliary circuit unit is connected to the pull-up control signal end of the $N^{th}$ row drive unit, and the output end of the $N^{th}$ auxiliary circuit unit is connected to the gate driving signal output end of the $N^{th}$ row drive unit;

the $N^{th}$ row drive unit is configured to output a $N^{th}$ gate driving signal to pre-charge and charge $N^{th}$ row of sub-pixels, when its signal input end receives the gate driving signal output by the $(N-2)^{th}$ row drive unit;

the $N^{th}$ auxiliary circuit unit is configured to control the $N^{th}$ row drive unit and skip pre-charging the sub-pixels, when the $(N-1)^{th}$ timing control signal received by the first timing signal input end of the $N^{th}$ auxiliary circuit unit and the $(N+1)^{th}$ timing control signal received by the second timing signal input end of the $N^{th}$ auxiliary circuit unit are both high level;

N is a positive integer greater than or equal to two; and each of the auxiliary circuit units includes a first active switch, a second active switch, and a third active switch, at least one of the first active switch, the second active switch, and the third active switch is a thin film transistor.

The present disclosure further provides a display device, which includes:

a display panel including two sides facing each other, and a pixel array; and a row drive circuit of an array substrate as described above, the row drive circuit includes N row drive units arranged in cascade, and a plurality of auxiliary circuit units with each of the auxiliary circuit units corresponding to one of the row drive units, each side of the display panel is provided with the N row drive units arranged in cascade, and the auxiliary circuit units.

The row drive circuit of the present disclosure includes N row drive units arranged in cascade, and a plurality of auxiliary circuit units. Each of the auxiliary circuit units corresponds to one of the row drive units. The $N^{th}$ row drive unit is configured to output a $N^{th}$ gate driving signal to pre-charge and charge $N^{th}$ row of sub-pixels, when the signal input end of the $N^{th}$ row drive unit receives the gate driving signal output by the $(N-2)^{th}$ row drive unit. The $N^{th}$ auxiliary circuit unit is configured to control the $N^{th}$ row drive unit and skip pre-charging the sub-pixels, when the $(N-1)^{th}$ timing control signal received by the first timing signal input end of the $N^{th}$ auxiliary circuit unit and the $(N+1)^{th}$ timing control signal received by the second timing signal input end of the $N^{th}$ auxiliary circuit unit are both high level. In the present disclosure, the $N^{th}$ row of sub-pixels cannot be fully charged as the voltage of the $N^{th}$ row of sub-pixels should experience a ramping up phrase, while the $N^{th}$ row of sub-pixels can be pre-charged in advance, for making the $N^{th}$ row of sub-pixels to be fully charged. The $N^{th}$ auxiliary circuit unit is configured to stop pre-charging the $N^{th}$ row of sub-pixels, when the data voltage of the $(N-1)^{th}$ row of sub-pixels jumps from the positive level to be the data voltage with positive level, for avoiding to input voltages with opposite polarities into two adjacent rows of sub-pixels, and increasing the ramping up time of charging the $N^{th}$ row of sub-pixels. The waveform of the gate driving signal of the present disclosure can be designed according to the $N^{th}$ row drive unit and the $N^{th}$ auxiliary circuit unit, for ensuring the $N^{th}$ row of sub-pixels to be fully charged, it is beneficial to switch the polarity of the data signal from the positive to the negative or from the negative to the positive, as such each of the sub-pixels can be fully charged, and the sub-pixels all have the same brightness. The present disclosure solves the problem that the charging saturation of two adjacent pixels which both share one data line is inconsistent due to the excessive step-voltage of the data voltage, when the data signal is converted, as such bright lines and dark lines may be generated in the display panel. Therefore, the display device has a good displaying effect.

BRIEF DESCRIPTION OF THE DRAWINGS

To clearly illustrate the technical solutions that are reflected in various embodiments according to this disclosure or that are found in the prior art, the accompanying drawings intended for the description of the embodiments herein or for the prior art will now be briefly described, it is evident that the accompanying drawings listed in the following description show merely some exemplary embodiments according to this disclosure, and that those having ordinary skill in the art will be able to obtain other drawings based on the arrangements shown in these drawings without making inventive efforts.

The realizing of the aim, functional characteristics, advantages of the present disclosure are further described in detail with reference to the accompanying drawings and the embodiments.

DETAILED DESCRIPTION OF EMBODIMENTS

The present disclosure provides a row drive circuit of an array substrate, which can be applied to display devices having display panels, such as mobile phones, computers, televisions, and the like.

It can be understood that, the array substrate row drive means to scan the gates row by row by forming the gate row scan drive signal circuit on the array substrate of a display panel through a process for preparing thin film transistor liquid crystal display. Most of display panels employ the array substrate row drive as it has the advantages of production cost decrease and providing the display panel narrow bezel.

The pixels of the display panel can be arranged in various ways. According to the number of pixel rows which are turned on and the inputs of corresponding pixel signals at a certain time, the pixel driving structure can include an 1G1D structure that at a certain time only one pixel row is turned on, a 2G2D structure that at a certain time two pixel rows are turned on simultaneously, a dual-gate pixel driving structure, or a triple-gate pixel driving structure. Optionally, the display panel according to the exemplary embodiment adopts the dual-gate pixel structure. In the embodiment, the quantity of the row scan lines of the dual-gate pixel structure of the display panel are doubled, while the quantity of the data lines are reduced by half. Accordingly, the quantity of row drive circuits of the array substrate is doubled, while the quantity of source driving circuits can be reduced by half. Since the cost of the source driving circuits is much higher than that of the integrated chips in the gate driving chips, the production cost of the display device can be effectively reduced by adopting the dual-gate pixel driving structure.

Compared with the 1G1D structure, the row write time of the dual-gate pixel driving structure would be reduced to half of that of the 1G1D structure. In the design of the liquid crystal display panel, an important factor for considering the pixel driving structure is to ensure that the pixels have sufficient charging rate, and the reduction of row write time may decrease the charging rate of pixel. In order to ensure that the pixel has high charging rate and the display panel has good display effect, the display panel usually adopts 1+2-line inversion mode or two-line inversion mode to inverse the polarity of the capacitor in the pixel array.

When the display panel inverses the polarity of the capacitor in the pixel array through the 1+2-line inversion mode or two-line inversion mode, and the potential of the common electrode remains unchanged, driving the liquid crystal molecules through Alternating Current (AC) is realized by increasing and decreasing the potential of another electrode of the capacitor relative to the potential of the common electrode, which means that the voltage of the data signal increases or decreases relative to the common electrode voltage. During the process of the voltage of the data signal increasing relative to the voltage of the common electrode Vcom for making the polarity of the voltage of the data signal to inverse from negative to position, or during the process of the voltage of the data signal decreasing relative to the voltage of the common electrode Vcom for making the polarity of the voltage of the data signal inverting from position to negative, there exists a large step-voltage between the voltage of negative polarity and the voltage of position polarity, and the RC load is connected with the capacitor in series, switching the polarity of the voltage requires a ramping up time. If the charging time is fixed, the charging rate of the sub-pixels whose polarity of voltage needs to be switched or the voltage needs to undergo the ramping up time, is lower than that of the sub-pixels whose voltage tends to be stable, that is the saturation degree of the former is lower than that of the latter. The brightness of fully charged pixels is higher than that of undercharged pixels. For example, in the display panel of the exemplary embodiment, the odd row of thin film transistors and the adjacent even row thin film transistors are all electrically connected to the same data line, and the gates of odd row of thin film transistors and the gates of adjacent even row of thin film transistors are respectively controlled by two adjacent scan lines. The gate and source of the sub-pixel located in the first column and the first row are respectively connected to scan line G1 and data line D1, and the gate and the source of the sub-pixel located in the second column and the first row are respectively connected to scan line G2 and data line D1. When the polarities of the voltages of adjacent two sub-pixels are reversed by the two-line inversion mode, the polarities of the reversed voltages of the adjacent two sub-pixels are the same. When the polarities of the voltages of the sub-pixels are reversed by 1+2-line inversion mode, the polarities of the voltages of sub-pixels corresponding to the first row of scan line are different from the polarities of the voltages of sub-pixels corresponding to the next two rows of scan lines, and the polarities of the voltages of sub-pixels corresponding to two adjacent rows of scan lines other than the first row of scan line are the same. The exemplary embodiment takes the two-line inversion mode as an example to illustrate. When the row drive circuit performs row-by-row scanning process, the G1 row of scan line is first turned on, then the G2 row of scan line is turned on. In the 1+2-line inversion mode, the G2 row of scan line is turned on first, and the G3 row of scan line is turned on later. The polarity of the voltage of the sub-pixel in the first row and the first column is reversed from the positive to the negative. During the process of charging the sub-pixel in the first row and the first column, the data voltage on the data line D2 gradually decreases from the high level to the low level, that is, the polarity of the voltage of the sub-pixel is reversed from the positive to the negative and the voltage remains as low level. There exists a large step-voltage between the data signal voltage of negative polarity and the data signal voltage of position polarity, and the sub-pixel in the first column and the first row is not fully charged. After the sub-pixel in the first row and the first column is charged, the G1 row of scan line is turned off and the G2 row of scan line is turned on, for charging the sub-pixel in the second column and the first row. During the process of charging the sub-pixel in the second column and the first row, the data voltage on the data line D1 is kept at the low level, which means that the polarity of the data voltage on the data line D1 is reversed from negative to negative. At this time, there only exists a small step-voltage, or there is no step-voltage. Therefore, the sub-pixel can be fully charged. In this way, the brightness of the sub-pixel in the second column and the first row is higher than that of the sub-pixel in the first column and the first row, and so on, causing bright lines and dark lines in the entire liquid crystal panel.

In order to solve the above phenomenon, referring to FIGS. 1 to 7, the row drive circuit 100 according to an embodiment of the present disclosure includes:

N row drive units 10 arranged in cascade, each of the row drive units 10 includes a signal input end, a pull-up control signal end, and a gate driving signal output end; and a plurality of auxiliary circuit units 20 with each of the auxiliary circuit units 20 corresponding to one of the row drive units 10, each of the auxiliary circuit units 20 includes a first timing signal input end Ck(n−1), a second timing signal input end Ck(n+1), a first controlled end G(n), and an output end. The first timing signal input end Ck(n−1) of the $N^{th}$ auxiliary circuit unit 20 receives the $(N-1)^{th}$ timing control signal, the second timing signal input end Ck(n+1) of the $N^{th}$ auxiliary circuit unit 20 receives the $(N+1)^{th}$ timing control signal, the first controlled end and the output end of the $N^{th}$ auxiliary circuit unit 20 are connected to the gate driving signal output end of the $N^{th}$ row drive unit 10.

The $N^{th}$ row drive unit 10 is configured to output a $N^{th}$ gate driving signal to pre-charge and charge the $N^{th}$ row of sub-pixels, when its signal input end receives the gate driving signal output by the $(N-2)^{th}$ row drive unit 10.

The $N^{th}$ auxiliary circuit unit 20 is configured to control the $N^{th}$ row drive unit 10 and skip pre-charging the sub-pixels, when the $(N-1)^{t}$ timing control signal received by the first timing signal input end Ck(n−1) of the $N^{th}$ auxiliary circuit unit 20 and the $(N+1)^{th}$ timing control signal received by the second timing signal input end Ck(n+1) of the $N^{th}$ auxiliary circuit unit 20 are both high level.

N is a positive integer greater than or equal to 2.

In the embodiment, the display panel 200 includes a displaying area and a non-displaying area. the row drive units 10 are arranged in cascade and disposed in the non-displaying area. The non-displaying area can be arranged at one side or both sides of the display panel 200 according to the size of the display panel 200. In the embodiment, the non-displaying area is arranged at both sides of the display panel 200. In order to eliminate the bright and dark lines in the display panel 200 and to quickly complete the charging for pixels, each row drive unit 10 can enable the pre-charging function to turn on the signal of the subsequent row drive unit 10 in advance, so that the voltage of the subsequent row of pixels is converted to have the same polarity with the target voltage of the current frame in advance. The row drive unit and the auxiliary circuit unit may be circuit units composed of a plurality of thin film transistors.

For the dual-gate driving architecture, when one row scan line is turned on, the polarity of the sub-pixel corresponding to the row scan line is opposite to the polarity of the sub-pixel corresponding to adjacent row scan line. In the exemplary embodiment, the three neighboring sub-pixels are respectively regarded as the first sub-pixel, the second sub-pixel and the third sub-pixel. When the first row of sub-pixels are turned on, the polarity of the data voltage of the first row of sub-pixels jumps from positive to negative, or from negative to positive. The embodiment takes the polarity of the data voltage of the first row of sub-pixels jumping from negative to positive as an example to illustrate. The first row of sub-pixels need to undergo the ramping up process; the data voltage of the second row of sub-pixels has positive polarity and tends to be stable, such the second row of sub-pixels does not need to undergo the ramping up process; while the polarity of voltage of the third row of sub-pixels jumps from positive to the negative, so the third row of sub-pixels also need to undergo the ramping up process. Since the data voltage needs to undergo the ramping up process, the charging time of the first row of sub-pixels can include a charging time t1 for negative voltage with the voltage increasing from negative level to reference level, and a charging time t2 for increasing the voltage reference level to positive level. During the charging time t1, the first row of sub-pixels and the third row of sub-pixels all have the same polarity, so that the third row of sub-pixels can be turned on for pre-charging the third row of sub-pixels, and the polarity of the voltage for preharging is the same as that of the third row of sub-pixels in the current frame. The time for charging the second row of sub-pixels is t3. Since the data voltage of the second row of sub-pixels does not need to undergo the ramping up process, the time for the polarity of the second row of sub-pixels jumping from negative to positive is shorter, and the second row of sub-pixels have positive polarity, while the third row of sub-pixels have negative polarity. The auxiliary circuit unit 20 pulls down the gate driving signal for stopping pre-charging the third row of sub-pixels. When the third row of sub-pixels is started to be charged (i.e., the charging time t3), the auxiliary circuit unit 20 stops working, and the row drive unit 10 outputs the gate driving signal to the third row of sub-pixels for charging the third row of sub-pixels.

Figure 1:
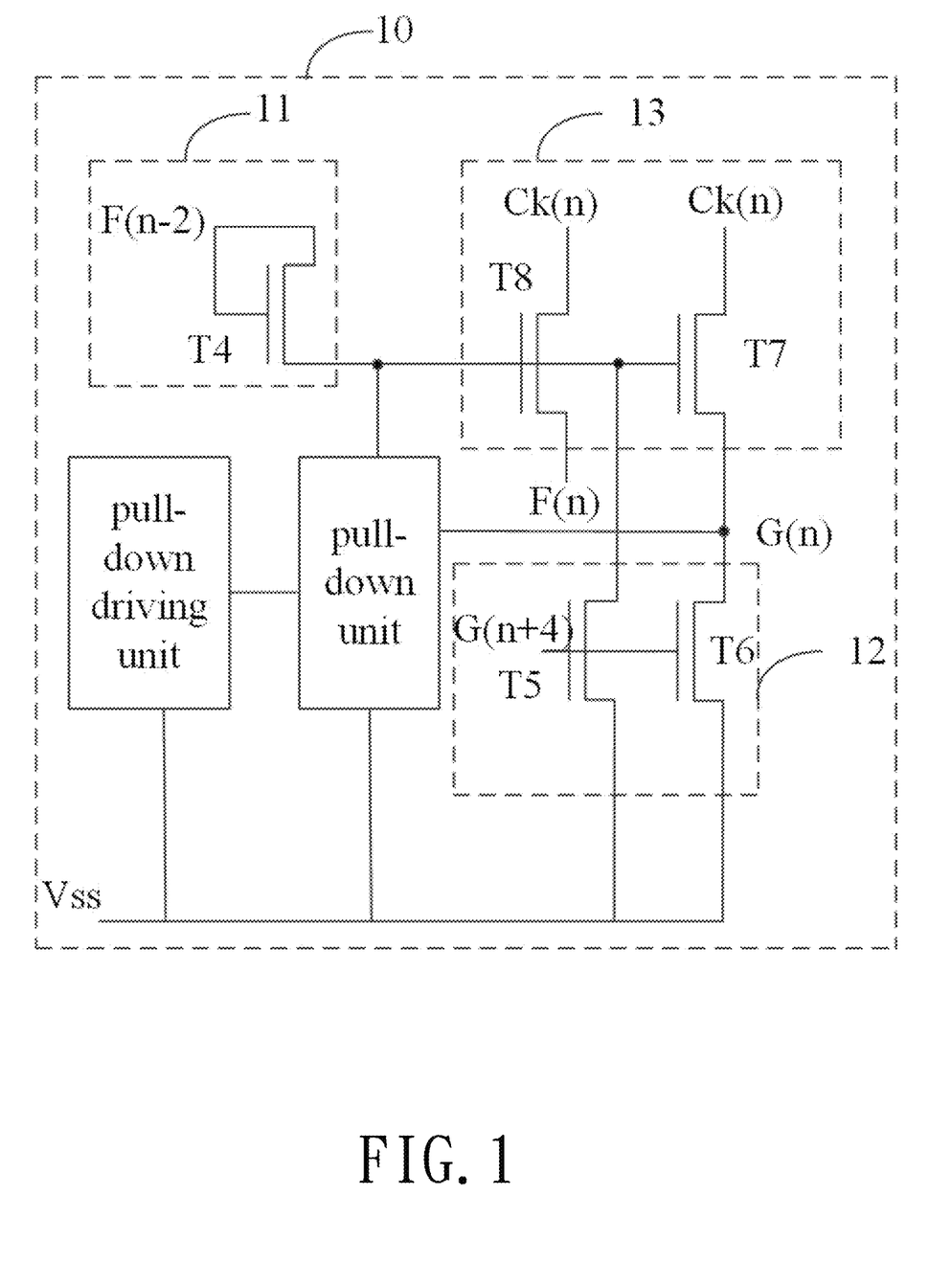
FIG. 1 is a circuit structure diagram showing an row drive unit of an array substrate in a row drive circuit of the array substrate according to an exemplary embodiment of the present disclosure.
Figure 2:
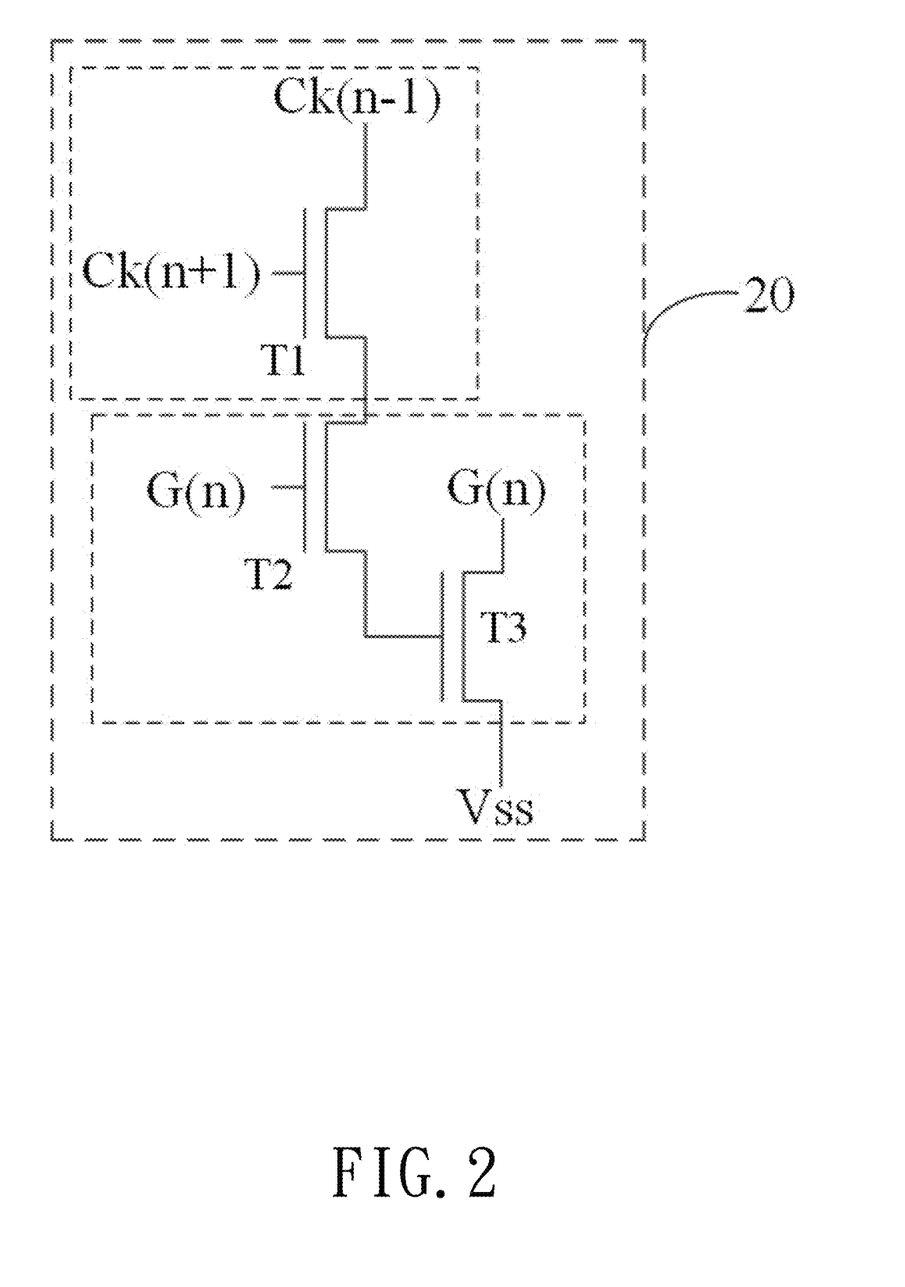
FIG. 2 is a circuit structure diagram of an auxiliary circuit unit in the row drive circuit according to an exemplary embodiment of the present disclosure.
Figure 3:
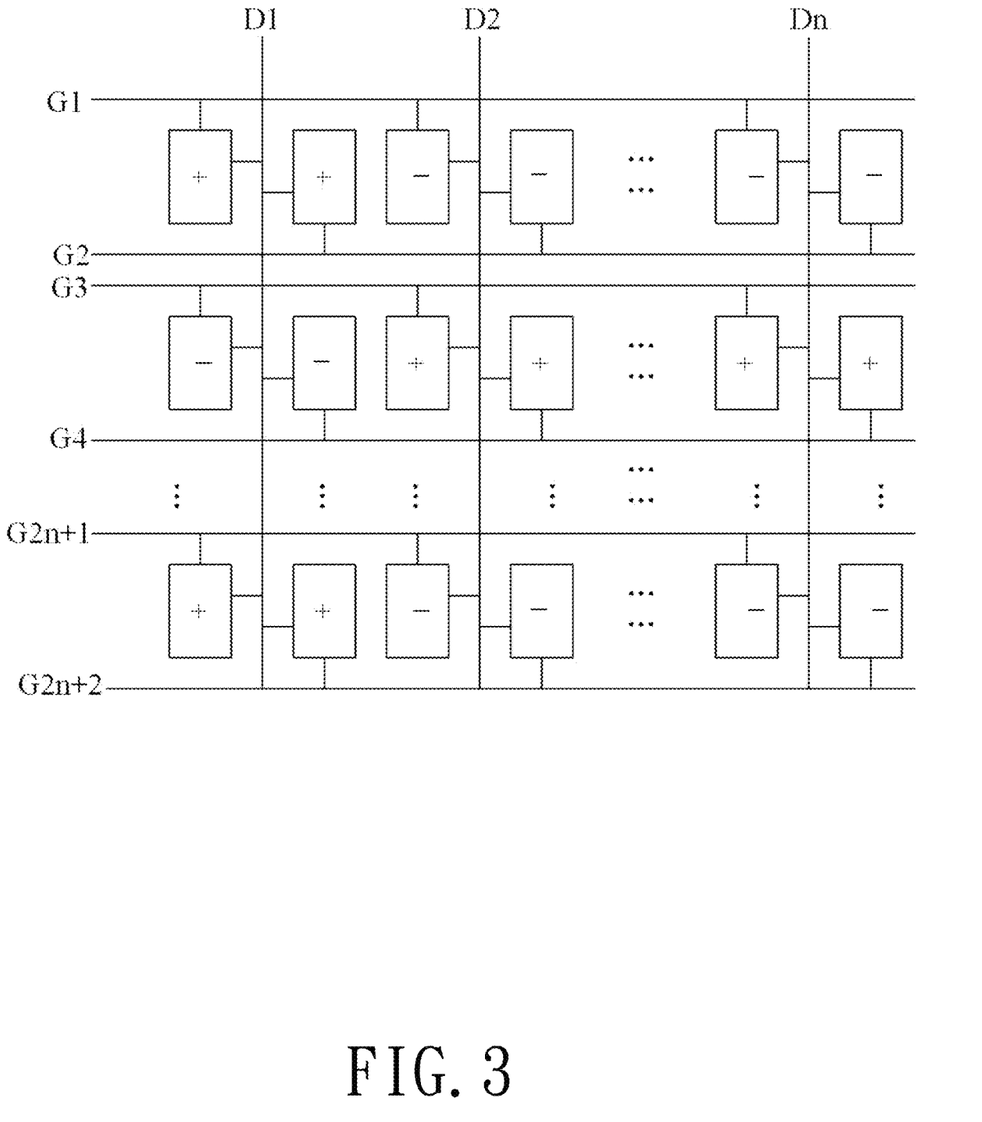
FIG. 3 is a schematic diagram showing a pixel arrangement of a display panel according to an exemplary embodiment of the present disclosure.
Figure 4:
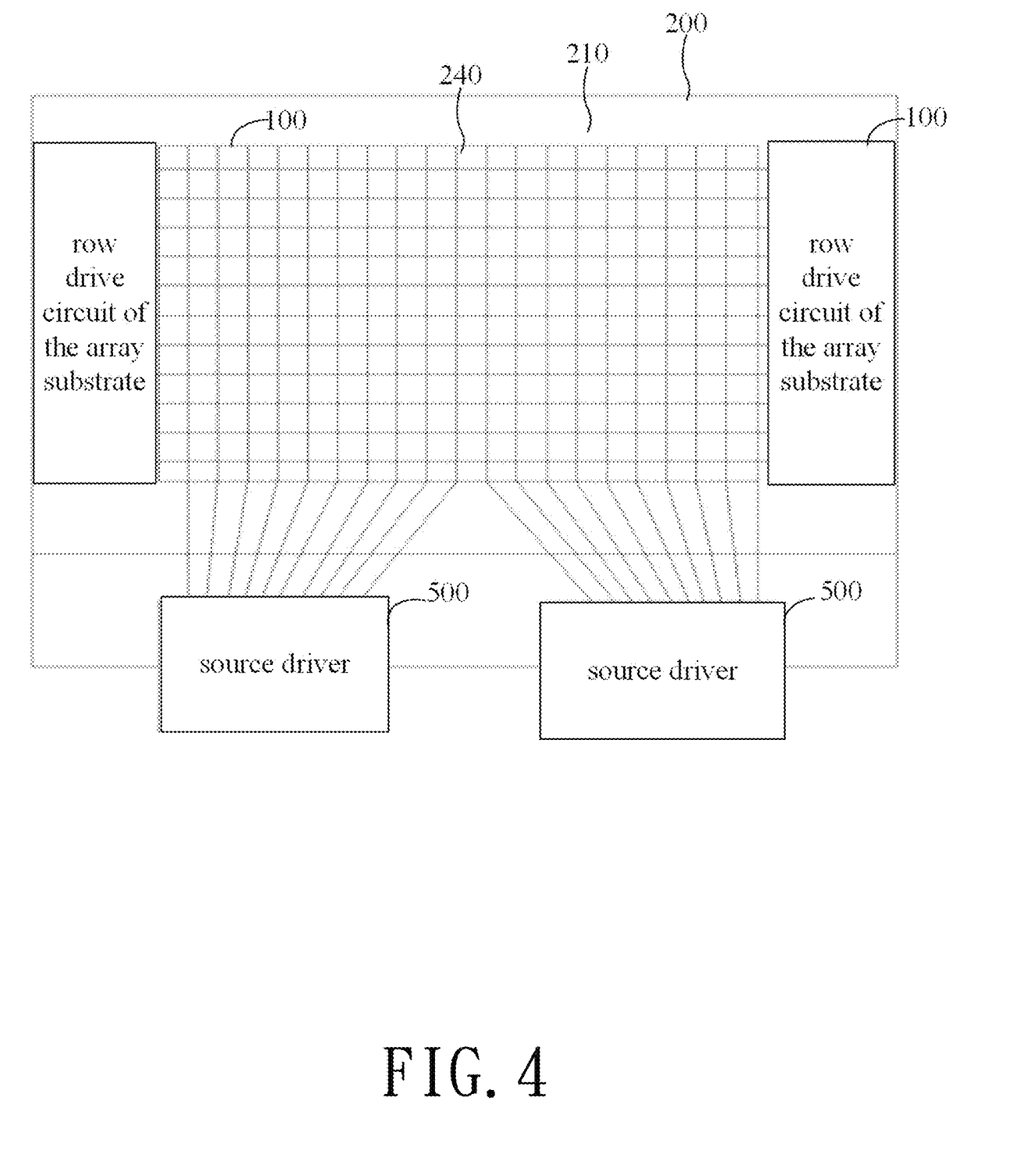
FIG. 4 is a structural diagram of a display device according to an exemplary embodiment of the present disclosure.
Figure 5:
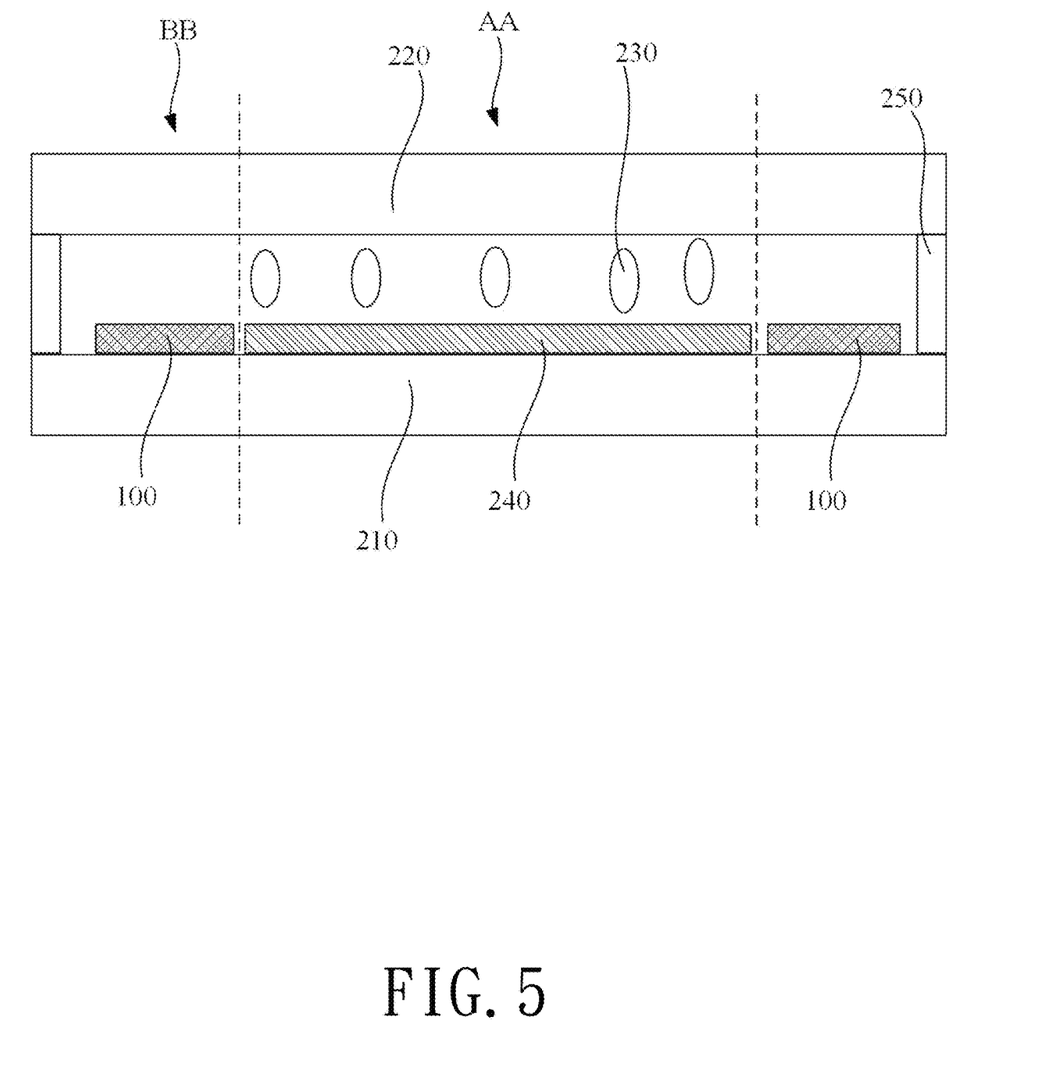
FIG. 5 is a structural diagram of the display panel according to another exemplary embodiment of the present disclosure.
Figure 6:
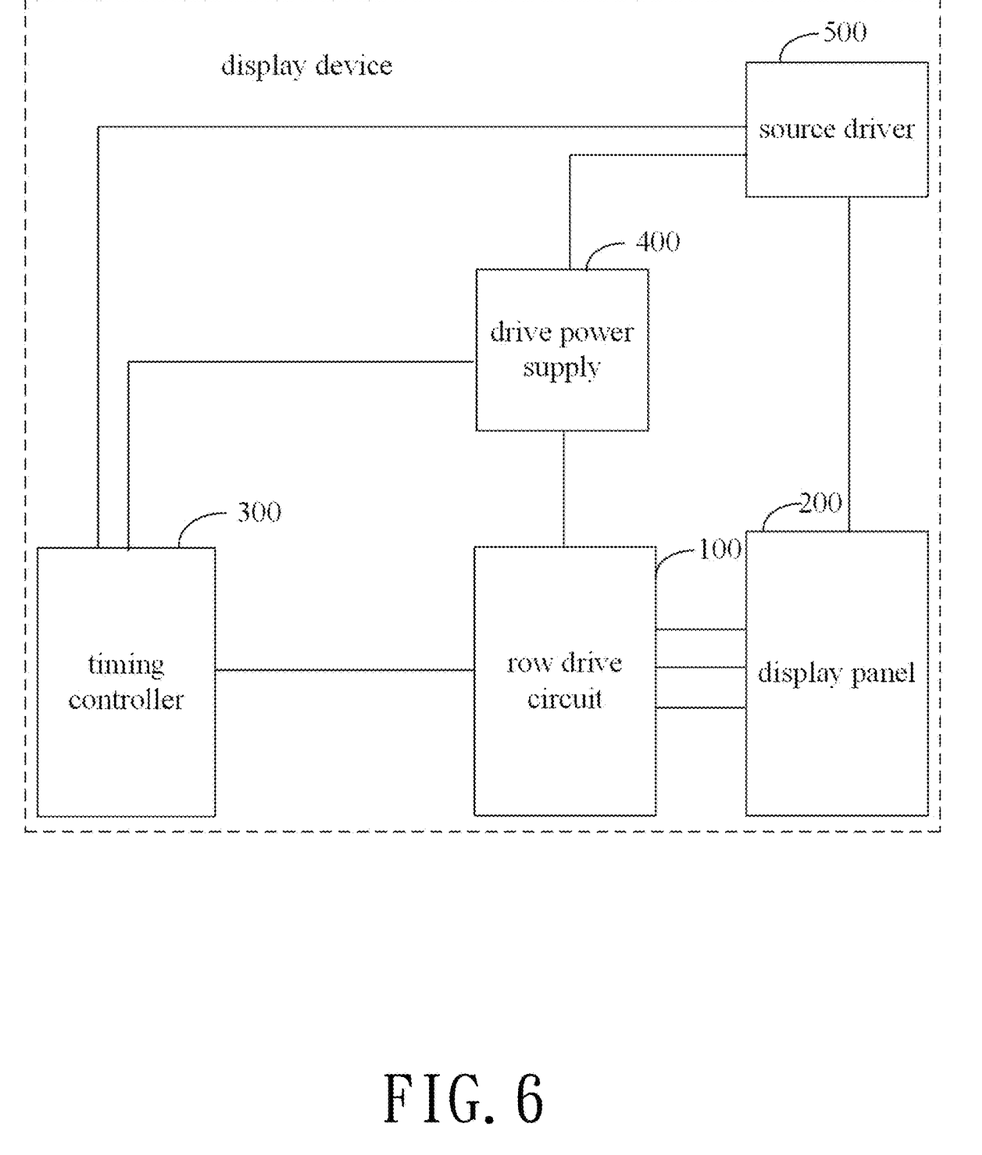
FIG. 6 is a circuit structure diagram of the display device according to an exemplary embodiment of the present disclosure.
Figure 7:
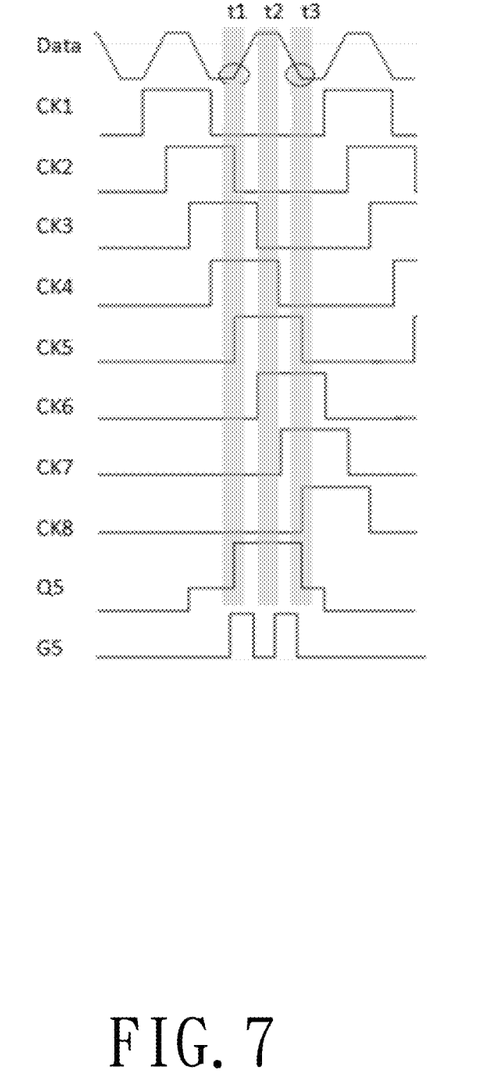
FIG. 7 is a timing diagram of the display device according to an exemplary embodiment of the present disclosure.

Specifically, referring to FIGS. 1 and 2, the embodiment takes the fifth row of sub-pixels as an example. The fifth row driving unit of the array substrate 10 corresponding to the fifth row of sub-pixels, the fifth auxiliary circuit unit 20 corresponding to the fifth row of sub-pixels, the change of the polarity of the data voltage of the fifth row of sub-pixels, the output diagram of each timing signal, and the output diagram of each data signal, are combined together and taken as an example to illustrate. In the row driving unit of the array substrate 10 corresponding to the fifth row of sub-pixels, the signal input end of the fifth row driving unit of the array substrate 10 receives the gate driving signal output by the third row driving unit of the array substrate 10, the first timing signal input end Ck(n−1) of the fifth auxiliary circuit unit 20 receives the fourth timing signal Ck4, the second timing signal input end Ck(n+1) receives the sixth timing signal Ck6, and the first controlled end G(n) receives the gate driving signal output by the gate driving signal output end G(n). Both the fifth auxiliary circuit and the fifth row driving unit of the array substrate 10 are triggered at the high level, that is, the fifth auxiliary circuit and the fifth row driving unit of the array substrate 10 both work at the high level and stop working at the low level.

When the third row drive unit 10 charges the third row of sub-pixels, the gate driving signal G3 of the third row drive unit 10 is the high level, for triggering the fifth row drive unit 10 to work. When the timing control signal Ck5 of the fifth row drive unit 10 is high level, the fifth row drive unit 10 outputs the gate driving signal G5 which is high level to the fifth row of sub-pixels, for pre-charging the fifth row of sub-pixels. At this time, the data voltage corresponding to the third row of sub-pixels jumps from the negative level to the positive level, and the fifth row of sub-pixels is pre-charged through the negative level data voltage. As the fourth row of sub-pixels need to be pre-charged, the fourth timing signal Ck4 should be high level, while the sixth timing signal Ck6 should be low level. The fifth auxiliary circuit unit 20 does not work, and the fifth row drive unit 10 pre-charges the fifth row of sub-pixels. The pre-charging time can be set according to the time of the data voltage of the third row of sub-pixels increasing from the negative level to the common electrode voltage Vcom, and the fifth row of sub-pixels are stopped pre-charging after the voltage of the third row of sub-pixels increases from the common electrode voltage Vcom to the positive level. In this way, the fifth row of sub-pixels can be pre-charged to compensate for the voltage part of the fifth row of sub-pixels that is not fully charged as the voltage of the fifth row of sub-pixels needs to undergo the ramping up process.

When the fourth row driving unit of the array substrate 10 charges the fourth row of sub-pixels, the gate driving signal G4 of the fourth row driving unit of the array substrate 10 is high level, and the fourth timing signal Ck4 is also high level. At this time, since the sixth row of sub-pixels needs to be pre-charged, the sixth timing signal Ck6 should be high level, while the fourth timing signal Ck4 should also be high level. Under the action of the gate driving voltage G3 of the third row driving unit of the array substrate 10, the gate driving signal output end G5 of the fifth row driving unit of the array substrate 10 remains at high level, thereby driving the fifth auxiliary circuit unit 20 to work and outputting the low level gate driving signal G5 to the fifth row of sub-pixels. When the fourth row of sub-pixels are charged, as the data voltage of the fourth row of sub-pixels jumps from the positive level to the position level, the fifth row of sub-pixels is stopped pre-charging, thus charging the fifth row of sub-pixels with voltage having the opposite polarity of the voltage of the fifth row of sub-pixels, and increasing the ramping up time of charging the sub-pixels of the fifth row. During the process, a time of the gate driving signals G5 outputting high level gate driving signal to the fifth auxiliary circuit unit 20, and another time of the fifth auxiliary circuit unit 20 outputting low level gate driving signal G5 to the fifth row of sub-pixels, are both greater than or equal to the pre-charging time t1 of the fifth row of sub-pixels. And the process would not affect the pre-charging time t1 of the fifth row of sub-pixels.

When the fifth row drive unit 10 charges the fifth row of sub-pixels, G3 received by the fifth row drive unit 10 remains as high level at this time, and the fifth timing signal Ck5 is also high level, thereby outputting a high level gate driving signal G5 to the fifth row of sub-pixels. At this time, the fourth timing signal Ck4 is low level, the sixth timing signal Ck6 is high level, the fifth auxiliary circuit unit 20 does not work, and the fifth row drive unit 10 drives the fifth row of sub-pixels to be charged. In this process, since the fifth row of sub-pixels has been pre-charged when the third row of sub-pixels are charged, the fifth row of sub-pixels do not need to undergo the ramping up process of jumping from the positive voltage to the negative voltage, thus enabling the fifth row of sub-pixels to be fully charged.

It can be understood that the embodiment takes the operation of the fifth row drive unit 10 as an example, and the operations of the other row drive units of the array substrate 10 can be obtained similarly, and are not described here. In addition, for the sub-pixels with polarities changing from positive to positive, as the storage capacitance of the sub-pixel is fixed, the sum of pre-charging amount and charging amount is equal to the sum of capacitance of sub-pixels, so that the voltage across the storage capacitor of the sub-pixel remains stable, when the sub-pixels are fully charged. The pre-charging operation can compensate the ramping up voltage, for improving the charging rate of the sub-pixels whose polarities need to be inverted. The pre-charging operation can also improve the charging rate of the sub-pixels whose polarities do not need to be inverted.

The row drive circuit 100 of the present disclosure includes N row drive units 10 arranged in cascade, and a plurality of auxiliary circuit units 20. Each of the auxiliary circuit units 20 corresponds to one of the row drive units 10. The $N^{th}$ row drive unit 10 is configured to output the $N^{th}$ gate driving signal to pre-charge and charge the $N^{th}$ row of sub-pixels, when the signal input end of the $N^{th}$ row drive unit receives the gate driving signal output by the $(N-2)^{th}$ row drive unit 10. The $N^{th}$ auxiliary circuit unit 20 is configured to control the $N^{th}$ row drive unit 10 and skip pre-charging the sub-pixels when the $(N-1)^t$ timing control signal received by the first timing signal input end Ck(n−1) of the $N^{th}$ auxiliary circuit unit 20 and the $(N+1)^{th}$ timing control signal received by the second timing signal input end Ck(n+1) of the $N^{th}$ auxiliary circuit unit 20 are both high level. In the present disclosure, the $N^{th}$ row of sub-pixels cannot be fully charged as the voltage of the $N^{th}$ row of sub-pixels should undergo a ramping up phrase, while the $N^{th}$ row of sub-pixels can be pre-charged in advance, for making the $N^{th}$ row of sub-pixels to be fully charged. The $N^{th}$ auxiliary circuit unit 20 is configured to stop pre-charging the $N^{th}$ row of sub-pixels, when the data voltage of the $(N-1)^{th}$ row of sub-pixels jumps from the positive level to be the data voltage with positive level, for avoiding to input voltages with opposite polarities into two adjacent rows of sub-pixels, and increasing the ramping up time of charging the $N^{th}$ row of sub-pixels. The waveform of the gate driving signal of the present disclosure can be designed according to the $N^{th}$ row drive unit 10 and the $N^{th}$ auxiliary circuit unit 20, for ensuring the $N^{th}$ row of sub-pixels to be fully charged. It is beneficial to switch the polarity of the data signal from the positive to the negative or from the negative to the positive, as such each of the sub-pixels can be fully charged, and the sub-pixels all have the same brightness. The present disclosure solves the problem that the charging saturation of two adjacent pixels which both share one data line is inconsistent due to the excessive step-voltage of the data voltage, when the data signal is converted, as such bright lines and dark lines may be generated in the display panel. Therefore, the display device has a good displaying effect.

Referring to FIGS. 1 to 7, in one embodiment, each of the auxiliary circuit units 20 includes a first active switch T1, a second active switch T2, and a third active switch T3. A controlled end of the first active switch T1 is the first timing signal input end Ck(n−1) of the auxiliary circuit unit 20, an input end of the first active switch T1 is the second timing signal input end Ck(n+1) of the auxiliary circuit unit 20, an output end of the first active switch T1 is connected to an input end of the second active switch T2, a controlled end of the second active switch T2 is the first controlled end G(n) of the auxiliary circuit unit 20, an output end of the second active switch T2 is connected to a controlled end of the third active switch T3, an input end of the third active switch T3 receives a gate closing signal, and an output end of the third active switch T3 is the output end of the auxiliary circuit unit 20.

In the embodiment, at least one of the first active switch T1, the second active switch T2, and the third active switch T3 is the thin film transistor. In the exemplary embodiment, the first active switch T1, the second active switch T2, and the third active switch T3 are all N-type thin film transistor which can be turned on at high level. In the exemplary embodiment, when the $(N-1)^{th}$ timing signal Ck(n−1), the pull-up signal Q(n), and the $(N+1)^{th}$ timing signal Ck(N+1) are high level, the first active switch T1 is controlled by the $(N-1)^{th}$ timing signal Ck(n−1), the second active switch T2 is controlled by the pull-up signal Q(n) of the pull-up control end, and the third active switch T3 is controlled by the $(N+1)^{th}$ timing signal Ck(N+1). The third active switch T3 is turned on and outputs the $(N-1)^{th}$ timing signal Ck(n−1), when the $(N+1)^{th}$ timing signal Ck(n+1) is high level. The second active switch T2 is turned on when the gate driving signal output end G(n) is high level. When the first active switch T1 and the second active switch T2 are turned on, and the $(N-1)^{th}$ timing signal Ck(n−1) input into the input end of the first active switch T1 is high level, the third active switch T3 is in working state, for pulling down the voltage of the gate driving signal output end of the $N^{th}$ row driving unit of the array substrate 10, so that the $(N-1)^{th}$ row driving unit of the array substrate 10 outputs the gate driving signal and charges the $(N-1)^{th}$ row of sub-pixels. The $N^{th}$ row driving unit of the array substrate 10 is controlled to stop pre-charging the sub-pixels. Therefore, data voltages with opposite polarities are avoided to inputting into two adjacent rows of sub-pixels, and the ramping up time of the fifth row of sub-pixels is increased.

It can be understood that the on/off time of the second active switch T2 is greater than or equal to the pre-charging time of its corresponding sub-pixel. When the first active switch T1 and the second active switch T2 are turned on by high level signal (the second active switch T2 is turned on when receiving the high level gate drive signal output by the gate driving signal output end), for turning on the third active switch T3. Further, the sub-pixels can be fully precharged during the process of pulling down the gate driving voltage of the gate driving signal output. Then, the second active switch T2 is turned off as the third active switch T3 is turned on and pulls down the gate driving signal output by the gate driving signal output end. That is, the sub-pixels are fully pre-charged first, and then the second active switch T2 is turned off subsequently; or the sub-pixels are fully precharged, meanwhile the second active switch T2 is turned off in the light of the low level gate driving signal output by the third active switch T3. The on/off of the second active switch T2 does not affect the pre-charging of the sub-pixels during the pre-charging time t1.

Referring to FIGS. 1 to 7, in one embodiment, each row driving unit of the array substrate 10 includes a charging unit 11, a reset unit 12, and an output unit 13. The input end of the charging unit 11 is the signal input end of the row driving unit of the array substrate 10, the output end of the charging unit 11 is the pull-up control signal end of the row driving unit of the array substrate 10 and is connected with the controlled end of the output unit 13. The input end of the output unit 13 is connected with a current-stage timing signal, and the output end of the output unit 13 is the gate driving signal output end of the row driving unit of the array substrate 10.

In the exemplary embodiment, each row driving unit of the array substrate 10 includes the charging unit 11, the output unit 13, and the reset unit 12. The charging unit 11, the output unit 13, and the reset unit 12 are composed by thin film transistors and cooperatively form a circuit structure.

The charging unit 11 is mainly configured to output the pull-up control signal. The input end of the output unit 13 is connected to the pull-up control signal output end Q(n) of the charging unit 11, and is mainly configured to output the gate driving signal G(n) according to the pull-up control signal Q(n). The reset unit 12 is connected to the charging unit 11, and the controlled end and the gate driving signal output end of the output unit 13. After the current row of pixel units are scanned, the reset unit 12 is configured to pull the pull-up control signal Q(n) and the row scan signal G(n) down to low level. The row driving unit of the array substrate 10 can also be provided with a bootstrap capacitor C which is configured to maintain the voltage between the output units 13, for stabilizing the output of the output units 13.

Before the output signal of the $(N-2)^{th}$ gate driving signal arrives, Ck(n) is low level, and the level of the pull-up control signal output end Q(n) is also low level, as such the output unit 13 does not output signal. When the output signal of the $(N-2)^{th}$ gate driving signal arrives, Ck(n) is low level, and the level of the pull-up control signal output end Q(n) is high level, and the signal output from the gate driving signal output end G(n) of the output unit 13 is low level.

When the output signal of the $(N-2)^{th}$ gate driving signal arrives, Ck(n) is high level, and the gate driving signal output terminal G(n) of the output unit 13 outputs the gate driving signal which is high level, for turning on the thin film transistor corresponding to the $N^{th}$ row of sub-pixels, thereby charging or pre-charging the $N^{th}$ row of sub-pixels.

Since the $N^{th}$ gate driving signal is the output signal of the $(N-2)^{th}$ row drive unit 10. When the $N^{th}$ row drive unit 10 charges the $N^{th}$ row of sub-pixels, the $(N+2)^{th}$ row drive unit 10 also pre-charges the $(N+2)^t$ sub-pixels. When the $(N+2)^{th}$ row of sub-pixels are charged, the gate driving signal output by the $(N+2)^{th}$ row drive unit 10 is output to the controlled end of the reset unit 12 of the $(N-2)^{th}$ row drive unit 10, thereby controlling the reset unit 12 to work, and the $(N+2)^{th}$ row drive unit 10 outputs the gate-off signal to the output unit 13, for controlling the output unit 13 to stop working, further turning off the thin film transistor corresponding to the $N^{th}$ row of sub-pixels.

Referring to FIGS. 1 to 7, in one embodiment, the charging unit 11 includes a fourth active switch T4, an input end and a controlled end of the fourth active switch T4 are the input end of the charging unit 11, and the output end of the fourth active switch T4 is the output end of the charging unit 11.

Optionally, the reset unit 12 includes a fifth active switch T5 and a sixth active switch T6. Controlled ends of the fifth active switch T5 and the sixth active switch T6 receive the gate driving signal output by the $(N+4)^{th}$ row drive unit 10, and the gate-off signal is input into input ends of the fifth active switch T5 and the sixth active switch T6. An output end of the fifth active switch T5 is connected to the pull-up control signal end, and an output end of the sixth active switch T6 is connected to the gate driving signal output end.

Optionally, the output unit 13 includes a seventh active switch T7 and an eighth active switch T8. A controlled end of the seventh active switch T7 is the controlled end of the output unit 13, and is connected with the controlled end of the eighth active switch T8.

An input end of the seventh active switch T7 is the input end of the output unit 13 and is connected with an input end of the eighth active switch T8, an output end of the seventh active switch T7 is the output end of the output unit 13. An output end of the eighth active switch T8 is connected with the signal input end of the $(N+2)^{th}$ row drive unit.

In the above embodiment, each active switch can be formed by the thin film transistor, such as N-type thin film transistor which can be turned on by high level.

In the above embodiment, each row drive unit 10 further includes a pull-down unit and a pull-down drive unit, and the pull-down unit is configured to output a reset signal to the output end and the controlled end of the output unit 13 for stopping the output unit 13 from working.

The present disclosure also provides a row drive circuit of array substrate 100 which includes:

N row drive units 10 arranged in cascade, each of the row drive units 10 includes a signal input end, a pull-up control signal end, and a gate driving signal output end; and a plurality of auxiliary circuit units 20 with each of the auxiliary circuit units 20 corresponding to one of the row drive units 10, each of the auxiliary circuit units 20 includes a first timing signal input end Ck(n−1), a second timing signal input end Ck(n+1), a first controlled end G(n), and an output end G(n). The first timing signal input end Ck(n−1) of the $N^{th}$ auxiliary circuit unit 20 receives the $(N-1)^{th}$ timing control signal, the second timing signal input end Ck(n+1) of the $N^{th}$ auxiliary circuit unit 20 receives the $(N+1)^{th}$ timing control signal, the controlled end of the $N^{th}$ auxiliary circuit unit 20 is connected to the pull-up control signal end of the $N^{th}$ row drive unit 10, and the output end of the $N^{th}$ auxiliary circuit unit 20 is connected to the gate driving signal output end of the $N^{th}$ row drive unit 10.

The $N^{th}$ row drive unit 10 is configured to output a $N^{th}$ gate driving signal to pre-charge and charge $N^{th}$ row of sub-pixels, when its signal input end receives the gate driving signal output by the $(N-2)^{th}$ row drive unit 10.

The $N^{th}$ auxiliary circuit unit 20 is configured to control the $N^{th}$ row drive unit 10 and skip pre-charging the sub-pixels, when the $(N-1)^{th}$ timing control signal received by the first timing signal input end Ck(n−1) of the $N^{th}$ auxiliary circuit unit 20 and the $(N+1)^{th}$ timing control signal received by the second timing signal input end Ck(n+1) of the $N^{th}$ auxiliary circuit unit 20 are both high level.

N is a positive integer greater than or equal to 2.

Each of the auxiliary circuit units 20 includes a first active switch T1, a second active switch T2, and a third active switch T3. At least one of the first active switch T1, the second active switch T2, and the third active switch T3 is a thin film transistor.

The row drive circuit 100 of the present disclosure includes N row drive units 10 arranged in cascade, and a plurality of auxiliary circuit units 20. Each of the auxiliary circuit units 20 corresponds to one of the row drive units 10. The $N^{th}$ row drive unit 10 is configured to output the $N^{th}$ gate driving signal to pre-charge and charge the $N^{th}$ row of sub-pixels, when the signal input end of the $N^{th}$ row drive unit receives the gate driving signal output by the $(N-2)^{th}$ row drive unit 10. The $N^{th}$ auxiliary circuit unit 20 is configured to control the $N^{th}$ row drive unit 10 and skip pre-charging the sub-pixels when the $(N-1)^{t}$ timing control signal received by the first timing signal input end Ck(n−1) of the $N^{th}$ auxiliary circuit unit 20 and the $(N+1)^{th}$ timing control signal received by the second timing signal input end Ck(n+1) of the $N^{th}$ auxiliary circuit unit 20 are both high level. In the present disclosure, the $N^{th}$ row of sub-pixels cannot be fully charged as the voltage of the $N^{th}$ row of sub-pixels should undergo a ramping up phrase, while the $N^{th}$ row of sub-pixels can be pre-charged in advance, for making the $N^{th}$ row of sub-pixels to be fully charged. The $N^{th}$ auxiliary circuit unit 20 is configured to stop pre-charging the $N^{th}$ row of sub-pixels, when the data voltage of the $(N-1)^{th}$ row of sub-pixels jumps from the positive level to be the data voltage with positive level, for avoiding to input voltages with opposite polarities into two adjacent rows of sub-pixels, and increasing the ramping up time of charging the $N^{th}$ row of sub-pixels. The waveform of the gate driving signal of the present disclosure can be designed according to the $N^{th}$ row drive unit 10 and the $N^{th}$ auxiliary circuit unit 20, for ensuring the $N^{th}$ row of sub-pixels to be fully charged. It is beneficial to switch the polarity of the data signal from the positive to the negative or from the negative to the positive, as such each of the sub-pixels can be fully charged, and the sub-pixels all have the same brightness. The present disclosure solves the problem that the charging saturation of two adjacent pixels which both share one data line is inconsistent due to the excessive step-voltage of the data voltage, when the data signal is converted, as such bright lines and dark lines may be generated in the display panel. Therefore, the display device has a good displaying effect.

The present disclosure also provides a display device.

Referring to FIGS. 1 to 7, the display device includes a display panel 200 having two sides facing each other. The display panel 200 includes a pixel array 240.

The display panel 200 further includes the row drive circuit as described above 100. the row drive circuit 100 includes N row drive units 10 arranged in cascade, and a plurality of auxiliary circuit units 20, each of the auxiliary circuit units 20 corresponds to one of the row drive units 10, each side of the display panel 200 is provided with N row drive units 10 arranged in cascade, and auxiliary circuit units 20.

In the embodiment, the display panel 200 may be an organic light-emitting diode display panel, display panel 200 or a display panel of a Thin Film Transistor Liquid Crystal Display (TFT-LCD). And the display panel 200 can be divided into System On Chip(SOC) type display panel and Gate Driver On Array (GOA) type display panel according to the design of gate driver. the row drive circuit 100 adopts the technology of forming the gate driving circuit on the array substrate of the display device instead of forming the driving chip through an external silicon. The above technology can reduce the production processes and the process cost of product, and improve the integration level of the display panel 200. The array substrate row driving display panel 200 has a narrower frame than the SOC type display panel 200. With the progress of science and technology and people's higher requirements for visual effects, the narrow frame of the display panel 200 is the mainstream trend in the future. Therefore, the array substrate row drive display panel 200 is a more important than the SOC type display panel 200. In the exemplary architecture of the array substrate row driving type display panel 200, liquid crystal molecules are filled between the upper and lower glass substrates, and the periphery of the display panel is sealed with a sealing material. The liquid crystal is a polymer material and widely used in light and thin display technology because of its special physical, chemical, and optical properties.

In the exemplary embodiment, the pixel array 240 of the display panel 200 is composed of a plurality of sub-pixels, and a red sub-pixel, a green sub-pixel, and a blue sub-pixel would constitute one pixel. For example, the sub-pixels which are arranged in one same row and positioned on the display panel 200 can be turned on simultaneously. For some large-sized display panels 200, since the resistances of the scan lines at the area away from the gate driver and the area close to the gate driver are different, and the sub-pixels in the same row are turned on at the same time, so that the data signals are output to the sub-pixel at the same time, which may inevitably lead to uneven brightness of the display panel 200 due to uneven charging between the area away from the gate driver and the area close to the gate driver. Therefore, the left and right sides of the display panel 200 are both provided with the gate driver, and the timing controller is configured to output row drive signals of the array substrate, such as, frame start signal, scan clock pulse signal, clock signals Ck1 to Ckx, and low frequency signals LC1&LC2, etc., to the row drive circuits 100 arranged at two sides of the display panel. Then the row drive circuits 100 starts to work and turn on the scan lines in the display panel 100 row by row, for realizing the bilateral driving.

In some exemplary embodiments, the display device is further provided with a source driver 500, a timing controller 300, and a drive power supply 400. The source driver 500 is configured to input a data signal. The source driver 500 is mounted on a driving board, such as a Printed Circuit Board Assembly (PCBA). The source driver 500 is connected with the timing controller 300. A plurality of output ends of the source driver 500 are respectively connected with corresponding data lines of the pixel array 240. The timing controller receives data signal, control signal, and clock signal output by an external control circuit, for example, a control system of a television which is also called as a System on a Chip (SOC), and converts the received data signal, control signal, and clock signal into data signal, control signal and clock signal which are suitable for the row drive circuits 100 and the source driver 500, then the source driver 500 outputs the converted data signal to corresponding pixel through data line, for displaying images by the display panel 200. There are a plurality of source drivers 500, specifically, the quantity of the source drives 500 can be set according to the size of the display panel 200. In this exemplary embodiment, taking the display panel 200 having two source drivers 500 as an example, an output end of the drive power supply 400 is connected to the row drive circuit 100 and the source driver 500. The drive power supply 400 integrates a plurality of DC-DC conversion circuits with different circuit functions, and the conversion circuits can output different voltages. The voltage input into the drive power supply 40 is generally 5V or 12V, and the voltage output by the drive power supply 40 includes the operating voltage supplied to the timing controller 11, gate-on voltage VGH and the gate-off voltage VGL both supplied to the gate driver. And the operating voltage is also called as Digital Voltage Drain Drain (DVDD), and the gate on voltage VGH and the off voltage VGL supplied to the gate driver.

Referring to FIGS. 1 to 7, the display panel 200 according to an exemplary embodiment includes:

a pixel array 240;

a first substrate 210, including a display region and a peripheral region, the pixel array 240 is arranged on the first substrate 210 and positioned in the display area; the N row drive units 10 arranged in cascade, and the auxiliary circuit units 20 are arranged on the first substrate 210 and are positioned in the peripheral area;

a second substrate 220, facing the first substrate 210;

a liquid crystal layer, disposed between the first substrate 210 and the second substrate 220, the liquid crystal layer includes a plurality of liquid crystal molecules, and the pixel array 240 is configured to control the motions of the plurality of liquid crystal molecules.

In the exemplary embodiment, the first substrate 210 and the second substrate 220 are generally transparent substrates, such as glass substrates or plastic substrates. The second substrate 220 faces the first substrate 210, and a corresponding circuit may be disposed between the first substrate 210 and the second substrate 220.

The pixel array 240 is disposed on the first substrate 210 and located in the display area AA. Under the driving control of the row drive circuit 100, the pixel array 240 can generate a control signal to control the display of the display panel 200. the row drive circuit 100 is disposed on the first substrate 210 and located in the non-display region BB. Accordingly, the row drive circuit 100 can isolate the row drive circuit 100 from the liquid crystal layer 23 through an isolation structure, so that a liquid crystal free region is formed between each of the row drive circuits 100 and the second substrate 220.

The display panel 200 according to the above exemplary embodiment further includes a frame glue 250, which is disposed in the non-displaying area BB between the first substrate 210 and the second substrate 220 and surrounds the liquid crystal layer 23. The row drive circuit 100 is located between the frame glue 250 and the display area AA. The frame glue 250 may be formed by coating sealant on the first substrate 210 or the second substrate 220 to connect the first substrate 210 with the second substrate 220, thereby realizing the assembly process of the display panel 200. Specifically, the pixel array 240 is a pixel array of a half source driven architecture.

Referring to FIGS. 1 to 7, in an alternative exemplary embodiment, the pixel array 240 includes a plurality of sub-pixels, each of the sub-pixels includes an active switch (namely a thin film transistor) and a pixel electrode, a gate of the active switch T is electrically connected with a scan line corresponding to the sub-pixel, a source of the active switch is electrically connected with a data line corresponding to the pixel unit, and a drain of the active switch is electrically connected with the pixel electrode of the sub-pixel. The pixel array 240 further includes a pixel electrode array connected to an element array composed of active switches.

The display panel 200 is composed of a plurality of pixels, and each of the pixels is composed of red sub-pixel, green sub-pixel, and blue sub-pixel. A circuit structure of each of the sub-pixels is generally provided with a thin film transistor and a capacitor, a gate of the thin film transistor is connected with a gate driver through the scan line, a source of the thin film transistor is connected with a source driver 500 through the data line, and a drain of the thin film transistor is connected with one end of the capacitor. The plurality of thin film transistors forms the thin film transistor array (not shown) of the exemplary embodiment. The thin film transistors 31 located in the same column are connected to the source driver 500 through one data line, and the thin film transistors located in the same row are connected to the gate driver through one scan line, thus forming a thin film transistor array. the row drive circuit 100 supplies voltage to the gates of several thin film transistors. The thin film transistors can be a-S thin film transistors or Poly-Si thin film transistors, and the Poly-Si thin film transistors can be formed by a Low Temperature Poly-Silicon (LTPS) technology and other technologies.

In the pixel array 240, the thin film transistors in odd-numbered columns are respectively connected to the scan lines in even-numbered rows, and the thin film transistors in even-numbered columns are electrically connected to the scan lines in odd-numbered rows respectively, and each of the odd-numbered columns of the thin film transistors and its adjacent even-numbered column of the thin film transistors are electrically connected to a same data line. The thin film transistors in odd-numbered columns are respectively connected to the scan lines in odd-numbered rows, and the thin film transistors in even-numbered columns are electrically connected to the scan lines in even-numbered rows respectively, and each of the odd-numbered columns of the thin film transistors and its adjacent even-numbered column of the thin film transistors are electrically connected to a same data line. Optionally, the polarity inversion mode of the switch array is 1+2-line inversion. Optionally, the polarity inversion mode of the switch array is two-line inversion.

The foregoing descriptions are merely optional implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A row drive circuit of an array substrate, wherein the row drive circuit comprises:

N row drive units arranged in cascade, each of the row drive units comprises a signal input end, and a gate driving signal output end; and a plurality of N auxiliary circuit units with each of the auxiliary circuit units corresponding to one of the row drive units, each of the auxiliary circuit units comprises a first timing signal input end, a second timing signal input end, a first controlled end, and an output end;

the first timing signal input end of the $N^{th}$ auxiliary circuit unit receives an $(N-1)^{th}$ timing control signal, the second timing signal input end of the $N^{th}$ auxiliary circuit unit receives an $(N+1)^{th}$ timing control signal, the first controlled end and the output end of the $N^{th}$ auxiliary circuit unit are connected to the gate driving signal output end of the $N^{th}$ row drive unit;

the $N^{th}$ row drive unit is configured to output an $N^{th}$ gate driving signal for pre-charging and charging the $N^{th}$ row of sub-pixels when a signal input end of the $N^{th}$ row drive unit receives the gate driving signal output by the $(N-2)^{th}$ row drive unit;

the $N^{th}$ auxiliary circuit unit is configured to control the $N^{th}$ row drive unit and skip pre-charging the sub-pixels when the $(N-1)^{th}$ timing control signal received by the first timing signal input end of the $N^{th}$ auxiliary circuit unit and the $(N+1)^{th}$ timing control signal received by the second timing signal input end of the $N^{th}$ auxiliary circuit unit are both at a high level; and wherein N is a positive integer greater than or equal to two.

2. The row drive circuit of the array substrate according to claim 1, wherein each of the auxiliary circuit units comprises a first active switch, a second active switch, and a third active switch, a controlled end of the first active switch is the first timing signal input end of the auxiliary circuit unit, an input end of the first active switch is the second timing signal input end of the auxiliary circuit unit, an output end of the first active switch is connected to an input end of the second active switch, a controlled end of the second active switch is the first controlled end of the auxiliary circuit unit, an output end of the second active switch is connected to a controlled end of the third active switch, an input end of the third active switch receives a gate closing signal, and an output end of the third active switch is the output end of the auxiliary circuit unit.

3. The row drive circuit of the array substrate according to claim 1, wherein each of the row drive units comprises a charging unit, a reset unit, and an output unit, an input end of the charging unit is the signal input end of the row drive unit, an output end of the charging unit is a pull-up control signal end of the row drive unit, and is connected with a controlled end of the output unit, an input end of the output unit receives a current-stage timing signal, and an output end of the output unit is the gate driving signal output end of the row drive unit.

4. The row drive circuit of the array substrate according to claim 3, wherein the charging unit comprises a fourth active switch, an input end and a controlled end of the fourth active switch are defined as the input end of the charging unit, and an output end of the fourth active switch is the output end of the charging unit.

5. The row drive circuit of the array substrate according to claim 4, wherein the output unit comprises a seventh active switch and an eighth active switch, a controlled end of the seventh active switch is the controlled end of the output unit, and is connected to a controlled end of the eighth active switch, and an input end of the seventh active switch is the input end of the output unit and is connected to an input end of the eighth active switch; an output end of the seventh active switch is the output end of the output unit, and an output end of the eighth active switch is the signal input end of an $(N+2)^{th}$ row drive unit.

6. The row drive circuit of the array substrate according to claim 3, wherein the reset unit comprises a fifth active switch and a sixth active switch, controlled ends of the fifth active switch and the sixth active switch receive the gate driving signal output by an $(N+4)^{th}$ row drive unit, and input ends of the fifth active switch and the sixth active switch respectively receive a gate closing signal; an output end of the fifth active switch is connected to the pull-up control signal end, and an output end of the sixth active switch is connected to the gate driving signal output end.

7. The row drive circuit of the array substrate according to claim 6, wherein the output unit comprises a seventh active switch and an eighth active switch, a controlled end of the seventh active switch is the controlled end of the output unit, and is connected to a controlled end of the eighth active switch, and an input end of the seventh active switch is the input end of the output unit and is connected to an input end of the eighth active switch; an output end of the seventh active switch is the output end of the output unit, and an output end of the eighth active switch is the signal input end of an $(N+2)^{th}$ row drive unit.

8. The row drive circuit of the array substrate according to claim 3, wherein the output unit comprises a seventh active switch and an eighth active switch, a controlled end of the seventh active switch is the controlled end of the output unit, and is connected to a controlled end of the eighth active switch, and an input end of the seventh active switch is the input end of the output unit and is connected to an input end of the eighth active switch; an output end of the seventh active switch is the output end of the output unit, and an output end of the eighth active switch is the signal input end of an $(N+2)^{th}$ row drive unit.

9. A row drive circuit of an array substrate, wherein the row drive circuit comprises:
   N row drive units arranged in cascade, each of the row drive units comprises a signal input end, a pull-up control signal end, and a gate driving signal output end; and
   a plurality of N auxiliary circuit units with each of the auxiliary circuit units corresponding to one of the row drive units, each of the auxiliary circuit units comprises a first timing signal input end, a second timing signal input end, a first controlled end, and an output end;
   the first timing signal input end of the $N^{th}$ auxiliary circuit unit receives an $(N-1)^{t}$ timing control signal, the second timing signal input end of the $N^{th}$ auxiliary circuit unit receives an $(N+1)^{th}$ timing control signal, the first controlled end and the output end of the $N^{th}$ auxiliary circuit unit are connected to the gate driving signal output end of the $N^{th}$ row drive unit;
   the $N^{th}$ row drive unit is configured to output an $N^{th}$ gate driving signal for pre-charging and charging the $N^{th}$ row of sub-pixels when a signal input end of the $N^{th}$ row drive unit receives the gate driving signal output by the $(N-2)^{th}$ row drive unit;
   the $N^{th}$ auxiliary circuit unit is configured to control the $N^{th}$ row drive unit and skip pre-charging the sub-pixels when the $(N-1)^{th}$ timing control signal received by the first timing signal input end of the $N^{th}$ auxiliary circuit unit and the $(N+1)^{th}$ timing control signal received by the second timing signal input end of the $N^{th}$ auxiliary circuit unit are both at a high level; and
   wherein N is a positive integer greater than or equal to two; and
   each of the N auxiliary circuit units comprises a first active switch, a second active switch, and a third active switch, at least one of the first active switch, the second active switch, and the third active switch being a thin film transistor.

10. A display device, wherein the display device comprises:
    a display panel comprising two sides facing each other, and a pixel array; and
    a row drive circuit of an array substrate comprising N row drive units arranged in cascade, and a plurality of N auxiliary circuit units with each of the N auxiliary circuit units corresponding to one of the N row drive units, each side of the display panel is provided with the N row drive units arranged in cascade, and the N auxiliary circuit units;
    the row drive circuit comprises:
    N row drive units arranged in cascade, each of the N row drive units comprises a signal input end, and a gate driving signal output end; and
    a plurality of N auxiliary circuit units with each of the N auxiliary circuit units corresponding to one of the N row drive units, each of the N auxiliary circuit units comprises a first timing signal input end, a second timing signal input end, a first controlled end, and an output end;
    the first timing signal input end of the $N^{th}$ auxiliary circuit unit receives an $(N-1)^{th}$ timing control signal, the second timing signal input end of the $N^{th}$ auxiliary circuit unit receives an $(N+1)^{th}$ timing control signal, the first controlled end and the output end of the $N^{th}$ auxiliary circuit unit are connected to the gate driving signal output end of the $N^{th}$ row drive unit;
    the $N^{th}$ row drive unit is configured to output an $N^{th}$ gate driving signal for pre-charging and charging the $N^{th}$ row of sub-pixels when a signal input end of the $N^{th}$ row drive unit receives the gate driving signal output by the $(N-2)^{th}$ row drive unit;
    the $N^{th}$ auxiliary circuit unit is configured to control the $N^{th}$ row drive unit and skip pre-charging the sub-pixels when the $(N-1)^{th}$ timing control signal received by the first timing signal input end of the $N^{th}$ auxiliary circuit unit and the $(N+1)^{th}$ timing control signal received by the second timing signal input end of the $N^{th}$ auxiliary circuit unit are both at a high level; and
    wherein N is a positive integer greater than or equal to two.

11. The display device according to claim 10, wherein the display panel comprises:
    a pixel array;
    a first substrate, comprising a display region and a peripheral region, the pixel array being arranged on the first substrate and positioned in the display area, the N row drive units arranged in cascade, and the auxiliary circuit units being arranged on the first substrate and positioned in the peripheral area;
    a second substrate, facing the first substrate; and
    a liquid crystal layer, defined between the first substrate and the second substrate, the liquid crystal layer comprising a plurality of liquid crystal molecules, the pixel array being configured to control motions of the plurality of liquid crystal molecules.

12. The display device according to claim 11, wherein the pixel array is a pixel array of a half source driven architecture.

13. The display device according to claim 10, wherein each of the auxiliary circuit units comprises a first active switch, a second active switch, and a third active switch, a controlled end of the first active switch is the first timing signal input end of the auxiliary circuit unit, an input end of the first active switch is the second timing signal input end of the auxiliary circuit unit, an output end of the first active switch is connected to an input end of the second active switch, a controlled end of the second active switch is the first controlled end of the auxiliary circuit unit, an output end of the second active switch is connected to a controlled end of the third active switch, an input end of the third active switch receives a gate closing signal, and an output end of the third active switch is the output end of the auxiliary circuit unit.

14. The display device according to claim 10, wherein each of the row drive units comprises a charging unit, a reset unit, and an output unit, an input end of the charging unit is the signal input end of the row drive unit, an output end of the charging unit is a pull-up control signal end of the row drive unit, and is connected with a controlled end of the output unit, an input end of the output unit receives a current-stage timing signal, and an output end of the output unit is the gate driving signal output end of the row drive unit.

15. The display device according to claim 14, wherein the charging unit comprises a fourth active switch, an input end and a controlled end of the fourth active switch are defined as the input end of the charging unit, and an output end of the fourth active switch is the output end of the charging unit.

16. The display device according to claim 15, wherein the output unit comprises a seventh active switch and an eighth active switch, a controlled end of the seventh active switch is the controlled end of the output unit, and is connected to a controlled end of the eighth active switch, and an input end of the seventh active switch is the input end of the output unit and is connected to an input end of the eighth active switch; an output end of the seventh active switch is the output end of the output unit, and an output end of the eighth active switch is the signal input end of an $(N+2)^{th}$ row drive unit.

17. The display device according to claim 14, wherein the reset unit comprises a fifth active switch and a sixth active switch, controlled ends of the fifth active switch and the sixth active switch receive the gate driving signal output by an $(N+4)^{th}$ row drive unit, and input ends of the fifth active switch and the sixth active switch respectively receive a gate closing signal; an output end of the fifth active switch is connected to the pull-up control signal end, and an output end of the sixth active switch is connected to the gate driving signal output end.

18. The display device according to claim 17, wherein the output unit comprises a seventh active switch and an eighth active switch, a controlled end of the seventh active switch is the controlled end of the output unit, and is connected to a controlled end of the eighth active switch, and an input end of the seventh active switch is the input end of the output unit and is connected to an input end of the eighth active switch; an output end of the seventh active switch is the output end of the output unit, and an output end of the eighth active switch is the signal input end of an $(N+2)^{th}$ row drive unit.

19. The display device according to claim 14, wherein the output unit comprises a seventh active switch and an eighth active switch, a controlled end of the seventh active switch is the controlled end of the output unit, and is connected to a controlled end of the eighth active switch, and an input end of the seventh active switch is the input end of the output unit and is connected to an input end of the eighth active switch; an output end of the seventh active switch is the output end of the output unit, and an output end of the eighth active switch is the signal input end of an $(N+2)^{th}$ row drive unit.

* * * * *